United States Patent [19]

Gumb et al.

[11] Patent Number: 4,731,833

[45] Date of Patent: Mar. 15, 1988

[54] LOW PROFILE CIRCUIT BOARD MOUNTED TELEPHONE JACK

[75] Inventors: Beverley W. Gumb; Eric Foster; Laurence J. Retallack, all of London, Canada

[73] Assignee: Northern Telecom Limited, Montreal, Canada

[21] Appl. No.: 775,281

[22] Filed: Sep. 12, 1985

[51] Int. Cl.⁴ .......................... H04R 9/00; H01R 9/00
[52] U.S. Cl. ..................................... 379/399; 439/632
[58] Field of Search .................. 179/178, 179, 100 R, 179/107, 102, 103; 339/17 C, 17 LC; 379/27, 399, 412, 419, 437, 438; 439/62, 76, 629–637

[56] References Cited

U.S. PATENT DOCUMENTS

| | | | |
|---|---|---|---|
| 4,124,785 | 11/1978 | Seretny et al. | 379/30 |
| 4,150,863 | 4/1979 | Krafthefer et al. | 439/629 |
| 4,186,988 | 2/1980 | Kobler | 439/676 |
| 4,225,209 | 9/1980 | Hughes | 439/344 |
| 4,291,202 | 9/1981 | Adams et al. | 379/370 |
| 4,296,991 | 10/1981 | Hughes et al. | 379/442 |
| 4,457,570 | 7/1984 | Bogese | 439/629 |
| 4,550,962 | 11/1985 | Czeschka | 439/78 |
| 4,556,264 | 12/1985 | Tanaka | 439/62 |
| 4,577,921 | 3/1986 | Bogese | 439/629 |
| 4,590,337 | 5/1986 | Engelmore | 379/438 |

*Primary Examiner*—Jin F. Ng
*Assistant Examiner*—Danita R. Byrd
*Attorney, Agent, or Firm*—Sidney T. Jelly

[57] ABSTRACT

A modular jack for a telephone, particularly for use in a handset, has a minimal height or profile by using a circuit board, on which the jack is mounted, as one of the walls defining the aperture into which a modular plug is inserted. The overall height of the jack is reduced by the thickness of the circuit board. The jack and board assembly has the smallest height dimension possible.

6 Claims, 6 Drawing Figures

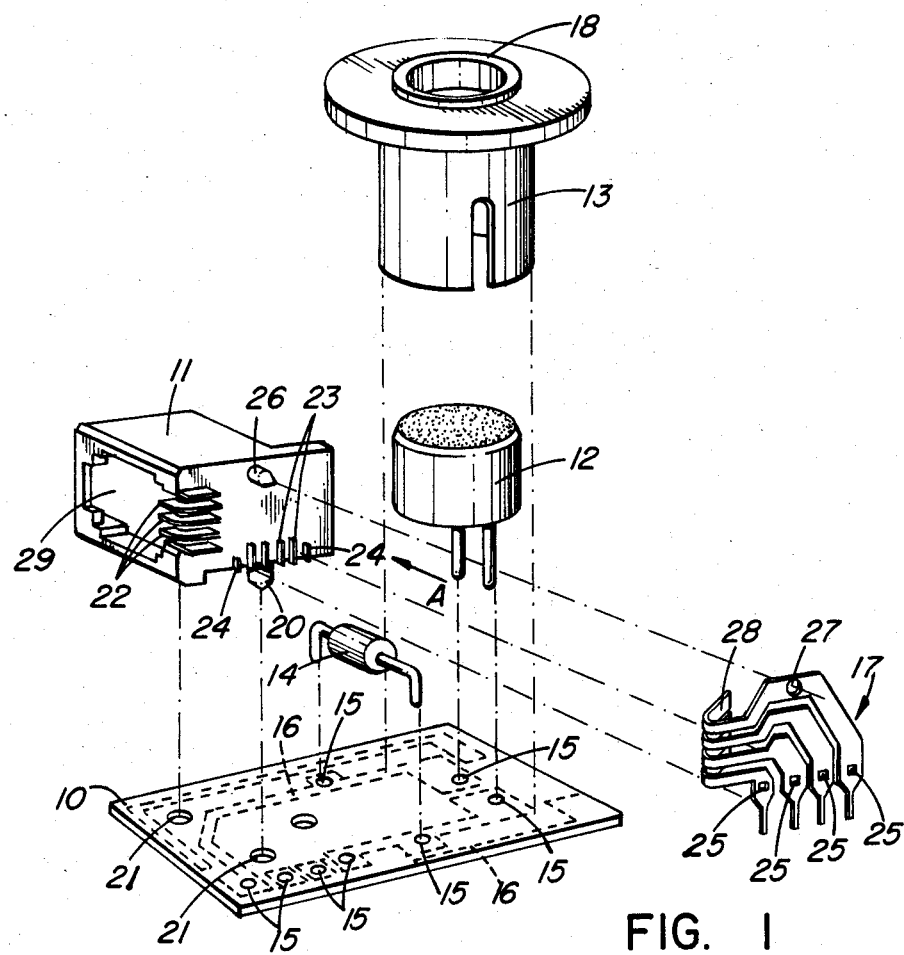
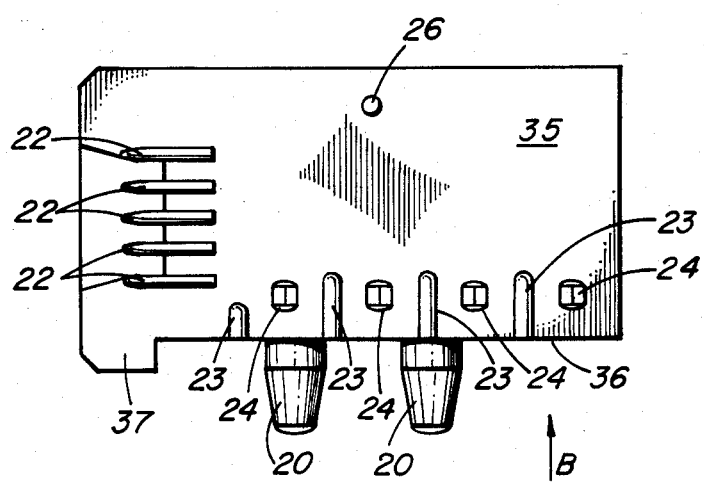

LOW PROFILE CIRCUIT BOARD MOUNTED TELEPHONE JACK

FIELD OF THE INVENTION

This invention relates to telephone jacks and is particularly concerned with providing a jack which is mounted on a circuit board and has a low or minimal profile, in a direction normal to the plane of the board. A specific application of the invention is to the plug provided in a handset for connection of the handset cord.

A handset of a telephone also has a transducer at each end, the receiver and transmitter and the handset cord usually enters the handset at the end at which is positioned the transmitter, connection being required between the handset cord and both transducers.

SUMMARY OF THE INVENTION

In its broadest aspect, a jack is mounted on a circuit board which also carries a circuit pattern to which other components are connected, the circuit board itself forming a side wall of the jack. By this arrangement, the overall thickness of circuit board and jack is the same as an individual jack which is a separate item. While such a reduction in thickness may seem a relatively minor feature, in a handset which is designed to have a minimal thickness such a reduction in the combined thickness of circuit board and jack can be very useful. A further advantage is that the assembly is very amenable to automated assembly.

BRIEF DESCRIPTION OF THE DRAWINGS

The invention will be readily understood by the following description of a particular embodiment, by way of example, in conjunction with the accompanying drawings, in which:

FIG. 1 is an exploded perspective view of a circuit board, jack and other components;

FIG. 2 is a side view of the jack, in the direction of arrow A in FIG. 1;

DESCRIPTION OF THE PREFERRED EMBODIMENT

Figure 3:
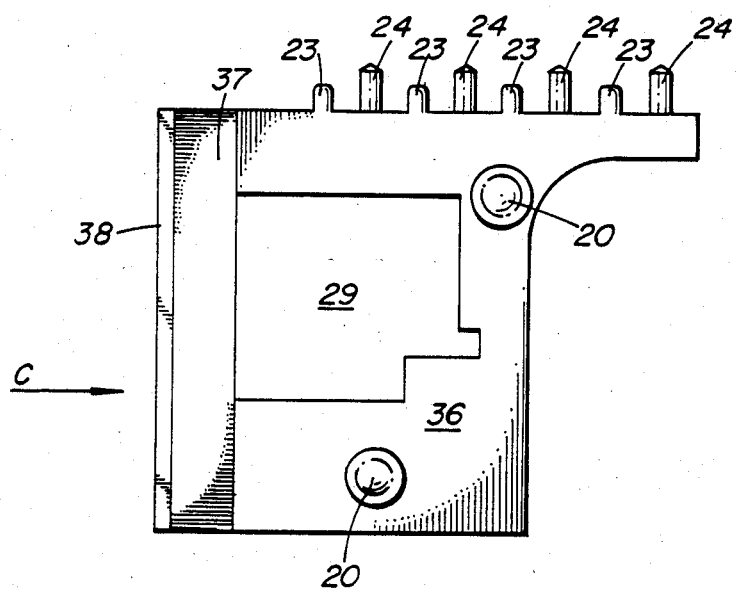
FIG. 3 is a bottom view in the direction of arrow B in FIG. 2.

Illustrated in FIG. 1 is a circuit board 10 on which are mounted a jack 11, a transducer 12, with a housing 13 and an electronic component 14. A circuit pattern is formed on the undersurface of the circuit board and lead holes 15 extend through the board 10 for connection to the circuit, indicated in dotted outline at 16. A lead assembly 17 is mounted on the jack 11 and extends through the board 10. In the embodiment illustrated, the transducer 12 is an electret microphone, the housing 13 and transducer 12 forming an accoustic assembly, with an aperture 18 against the outer surface of the handset when the handset is assembled. The electronic component 14 is, for example, a resistor.

Figure 4:
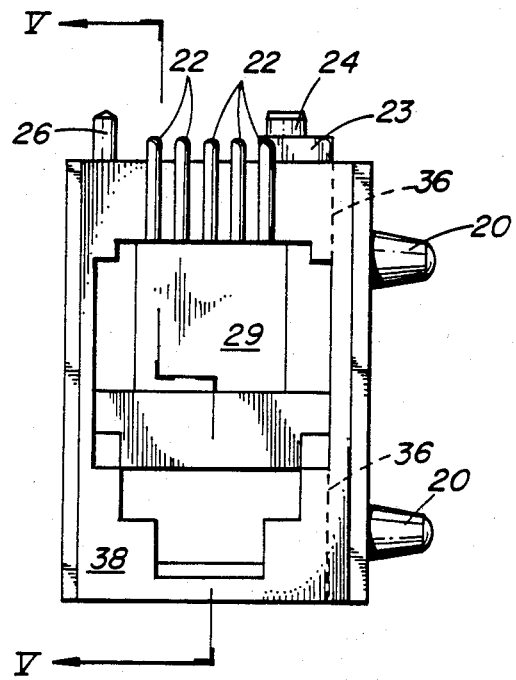
FIG. 4 is an end view in the direction of arrow C in FIG. 3.

The jack has projections on its lower side, one of which is seen at 20 in FIG. 1, the projections extending through holes 21 in the board. The projections are heat staked after assembly. The projections 20 are also seen in FIGS. 2, 3 and 4. The leads of the lead assembly are positioned at one end between ribs 22 on the jack and at the other end extend between ribs 23. Small projections 24 on the jack, between the ribs 23, extend through holes 25 in the leads and are heat staked after assembly. A further projection 26 and hole 27 are provided for the uppermost lead of the lead assembly. Cantilever ends 28 of the leads extend into a profiled aperture 29 of the jack 11 and act as spring contacts for making contact with the contacts of a plug on the end of a line cord. The profiled aperture 29 is normally positioned immediately adjacent to an aperture in the end of the handset housing when assembled to the handset.

FIGS. 2 to 5 illustrate the jack 11 in more detail. As seen in FIG. 2, the jack has a side surface 35, on which is mounted the lead assembly 17 of FIG. 1. Seen quite clearly are the ribs 22 and 23, projections 24 and projection 26. Also the projections 20 for positioning and holding the jack on the circuit board are seen. The bottom surface 36 has a downwardly extending rib 37. This rib abuts against the end of the circuit board 10 and provides some support against the effects of pushing in a plug.

FIG. 3 is a view on the surface 36. Normally the bottom wall of the jack would be a continuation of the rib 37, and the aperture 29 would be completely enclosed on all four sides. However, in the invention, the aperture extends through the bottom wall, that is, through the surface 36. This is seen in FIG. 3, the aperture 29 being seen. The circuit board closes the aperture on the surface 36, forming the lower or bottom wall.

FIG. 4 is a view on the front fact 38. The entrance to the profiled aperture 29 is seen. The ribs 22 extend down to the aperture 29, being recessed back a short distance from the front face 38.

Figure 5:
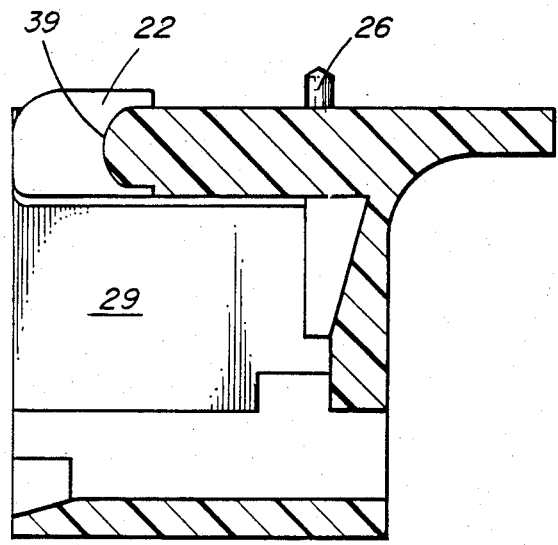
FIG. 5 is a cross-section on the line V—V of FIG. 4.

FIG. 5, a cross-section of the jack, shows the profiled aperture 29 in the jack. Also seen in FIG. 5 is the arcuate front edge 39 round which the ends of the leads extend to position the free, cantilever, ends in the aperture 29.

Figure 6:
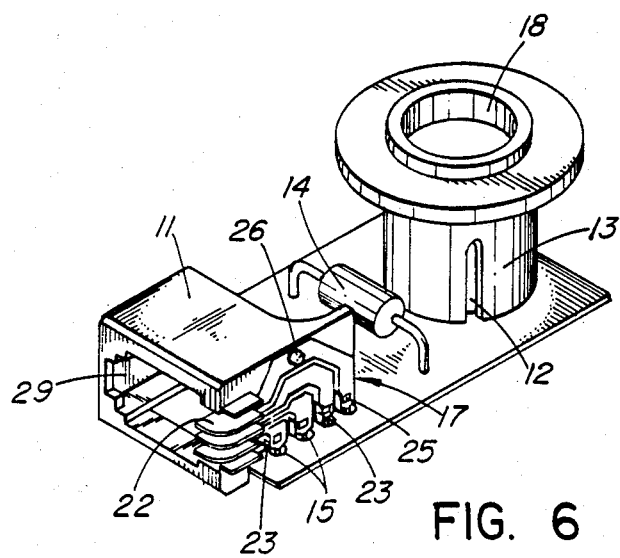
FIG. 6 is a perspective view of the assembled parts of FIG. 1.

FIG. 6 illustrates the circuit board, transducer and housing, lead assembly and electronic component assembled. The lead assembly 17 would normally be formed as part of a lead frame structure, with a side member joined to the contact sections 40 which extend through the board. The side member is sheared off after mounting of the leads on the jack.

It will be seen that the jack and circuit board provide the absolute minimum thickness at the position where jack and board combine. This will be at the extreme end of the handset where the handset thickness will be at its minimum. The circuit board acts to guide a plug into the aperture and into contact with the spring contact members 28.

What is claimed is:

1. A low profile circuit board mounted telephone jack assembly comprising:
    a telephone jack having a top wall, a bottom surface spaced from said top wall, and side walls extending between said top wall and said bottom surface to define a profiled aperture for reception of a telephone cord plug, said profiled aperture extending to and opening through said bottom surface; and a downwardly extending rib extending across said bottom surface at a front end thereof;

a circuit board mounted on said bottom surface of said jack and forming a bottom wall to said jack and closing said profiled aperture at said bottom surface, said circuit board including an edge in abutment with said rib;

a lead assembly mounted on one of said side walls, said lead assembly comprising a plurality of leads, each lead having a cantilever front end extending into said aperture, for contact by a contact member on a plug, each lead further including a rear end extending through said circuit board and connected to a circuit pattern on said circuit board.

2. A telephone jack assembly as claimed in claim 1, including a plurality of spaced parallel ribs on said one side wall at a front end thereof, said ribs extending down said front end of said one side wall to said aperture, said leads positioned between said parallel ribs.

3. A telephone jack assembly as claimed in claim 2, including a further plurality of spaced ribs on said side wall at said bottom surface, said leads positioned between said further ribs.

4. A telephone jack assembly as claimed in claim 1, including first projections on said bottom surface, said first projections extending through holes in said circuit board and being deformed over a surface of the circuit board remote from said jack, to retain said jack on said circuit board.

5. A telephone jack assembly as claimed in claim 1, said jack being mounted on a top surface of said circuit board, said circuit pattern formed on a bottom surface of said circuit board, and further including a transducer and at least one associated electrical component mounted on said top surface of said circuit board and connected to said circuit pattern.

6. A low profile circuit board mounted telephone jack assembly comprising:

a telephone jack having a top wall, a bottom surface spaced from said top wall, and side walls extending between said top wall and said bottom surface to define an aperture for reception of a telephone cord plug, said aperture extending to and opening through said bottom surface; a downwardly extending rib extending across said bottom surface at a front end thereof; and a plurality of projections on one of said side walls, adjacent to said bottom surface;

a circuit board mounted on said bottom surface of said jack and forming a bottom wall to said jack and closing said aperture at said bottom surface, said circuit board including an edge in abutment with said rib;

a lead assembly mounted on said one of said side walls, said lead assembly comprising a plurality of leads, each lead having a hole therein, respective ones of said plurality of said projections on one of said side walls extending through respective holes in the leads and being deformed over said leads to retain said leads in position on said one side wall, each lead including a cantilever front end extending into said aperture, for contact by a contact member on a plug, each lead further including a rear end extending through said circuit board and connected to a circuit pattern on said circuit board.

* * * * *